United States Patent
Suomi

(10) Patent No.: US 10,041,985 B2
(45) Date of Patent: Aug. 7, 2018

(54) METHOD AND APPARATUS FOR DETECTING VECTOR SHIFT

(71) Applicant: ABB Technology AG, Zurich (CH)

(72) Inventor: Frej Suomi, Vaasa (FI)

(73) Assignee: ABB Schweiz AG, Baden (CH)

( * ) Notice: Subject to any disclaimer, the term of this patent is extended or adjusted under 35 U.S.C. 154(b) by 48 days.

(21) Appl. No.: 15/097,067

(22) Filed: Apr. 12, 2016

(65) Prior Publication Data

US 2016/0334446 A1  Nov. 17, 2016

(30) Foreign Application Priority Data

May 13, 2015 (EP) .................................... 15167513

(51) Int. Cl.
*G01R 23/165* (2006.01)
*G01R 23/02* (2006.01)
(Continued)

(52) U.S. Cl.
CPC ........... *G01R 23/165* (2013.01); *G01R 23/02* (2013.01); *H02H 3/343* (2013.01); *H02H 3/353* (2013.01);
(Continued)

(58) Field of Classification Search
CPC ...... G01R 23/00; G01R 23/16; G01R 23/165; G01R 23/15; G01R 23/02; G01R 19/2513;
(Continued)

(56) References Cited

U.S. PATENT DOCUMENTS 4,346,332 A * 8/1982 Walden ............. H02M 7/53871
                                              315/224
4,617,636 A * 10/1986 Johns ....................... H02H 3/40
                                              324/556
(Continued)

FOREIGN PATENT DOCUMENTS

CN          101479612 A      7/2009
CN          102590615 A      7/2012
(Continued)

OTHER PUBLICATIONS

Laverty et al., Differential ROCOF Relay for Loss-of-Mains Protection of Renewable Generation using Phasor Measurement over Internet Protocol, Calgary 2009, www.cigre.org.*
(Continued)

*Primary Examiner* — Jermele M Hollington
*Assistant Examiner* — Sean Curtis
(74) *Attorney, Agent, or Firm* — Taft Stettinius & Hollister LLP; J. Bruce Schelkopf

(57) ABSTRACT

A method and an apparatus for detecting a vector shift in an AC power system, the apparatus comprising frequency measuring means adapted to determine a frequency of the AC power system, derivation means adapted to determine a time derivative of the frequency, filtering means adapted to filter the time derivative of the frequency, and detection means adapted to calculate time derivatives for the filtered time derivatives of the frequency over a time period having the length of the fundamental period of the AC power system, to determine a number of positive and negative time derivatives among the calculated time derivatives, and to detect a vector shift in the AC power system in response to an absolute value of a difference between the determined number of positive time derivatives and negative time derivatives exceeding a predetermined threshold value.

20 Claims, 3 Drawing Sheets

(51) Int. Cl.
*H02H 3/34* (2006.01)
*H02H 3/353* (2006.01)
*G01R 19/25* (2006.01)
*H02J 3/38* (2006.01)
*H02J 13/00* (2006.01)

(52) U.S. Cl.
CPC ....... *G01R 19/2513* (2013.01); *H02J 13/0006* (2013.01); *H02J 2003/388* (2013.01)

(58) Field of Classification Search
CPC ...... G01R 19/252; H02H 3/343; H02H 3/353; H02H 3/44; H02H 3/46; H02J 3/38; H02J 2003/388
USPC ......... 324/76.11, 76.12, 76.19, 76.21, 76.29, 324/76.39, 76.41, 76.44, 76.52, 76.68, 324/76.77, 600, 649, 650; 702/1, 57, 66, 702/71, 72, 75, 76, 77, 85, 106
See application file for complete search history.

(56) References Cited

U.S. PATENT DOCUMENTS

| | | | | | |
|---|---|---|---|---|---|
| 4,904,945 | A | * | 2/1990 | Kouan | G01R 15/207 324/547 |
| 5,061,890 | A | * | 10/1991 | Longini | G01R 21/133 324/103 R |
| 5,463,211 | A | * | 10/1995 | Arends | G06K 7/10851 235/462.27 |
| 5,517,106 | A | * | 5/1996 | Longini | G01R 21/133 324/103 R |
| 6,374,189 | B1 | * | 4/2002 | Sasai | G01R 23/165 324/76.19 |
| 7,453,674 | B2 | * | 11/2008 | Kuehnle | H02J 3/38 361/20 |
| 7,813,451 | B2 | * | 10/2010 | Binder | H04B 7/15542 307/424 |
| 8,190,299 | B2 | * | 5/2012 | Rovnyak | H02J 3/38 700/287 |
| 8,358,035 | B2 | * | 1/2013 | Bright | H02J 3/38 307/84 |
| 8,497,599 | B2 | * | 7/2013 | Roscoe | H02J 3/38 307/69 |
| 8,868,364 | B2 | * | 10/2014 | Antonesei | G01R 19/2513 702/75 |
| 9,325,175 | B2 | * | 4/2016 | Tumilty | H02J 3/38 |
| 9,697,876 | B1 | * | 7/2017 | Tiwari | G11C 7/065 |
| 2005/0231871 | A1 | * | 10/2005 | Karimi Ghartemani | G01R 19/2513 361/86 |
| 2007/0098075 | A1 | * | 5/2007 | Ohgose | H04N 19/61 375/240.16 |
| 2007/0144335 | A1 | * | 6/2007 | Derboven | G10H 1/383 84/613 |
| 2008/0232005 | A1 | * | 9/2008 | Kuehnle | H02J 3/38 361/21 |
| 2011/0068631 | A1 | * | 3/2011 | Roscoe | H02J 3/38 307/69 |
| 2012/0271575 | A1 | * | 10/2012 | Tumilty | H02J 3/38 702/60 |
| 2012/0278020 | A1 | * | 11/2012 | Antonesei | G01R 19/2513 702/75 |
| 2013/0301928 | A1 | * | 11/2013 | Springer | G06T 5/00 382/197 |
| 2013/0338954 | A1 | * | 12/2013 | Seki | G01R 19/2513 702/75 |
| 2013/0341922 | A1 | * | 12/2013 | Jimenez Buendia | G01R 23/00 290/44 |
| 2014/0225592 | A1 | * | 8/2014 | Hesse | H02J 3/38 324/76.39 |
| 2015/0015239 | A1 | * | 1/2015 | Antonesei | G01R 19/2513 324/76.39 |
| 2016/0072292 | A1 | * | 3/2016 | Rogers | H02J 3/46 307/62 |
| 2016/0084919 | A1 | * | 3/2016 | Gokaraju | H02H 7/065 702/182 |
| 2016/0147964 | A1 | * | 5/2016 | Corey | G06F 19/3406 700/90 |
| 2016/0329721 | A1 | * | 11/2016 | Rogers | H02J 11/00 |
| 2016/0334446 | A1 | * | 11/2016 | Suomi | G01R 23/165 |
| 2017/0094738 | A1 | * | 3/2017 | Garner | H05B 39/04 |

FOREIGN PATENT DOCUMENTS

| | | | |
|---|---|---|---|
| EP | 2113776 A1 | 11/2009 | |
| EP | 2660613 A1 | 11/2013 | |
| EP | 2538517 A1 | 10/2015 | |
| EP | 3093943 A1 * | 11/2016 | ........... G01R 23/165 |
| GB | 413634 A * | 7/1934 | ............... G05F 1/00 |
| WO | 0069042 A1 | 11/2000 | |
| WO | 0182444 A1 | 11/2001 | |

OTHER PUBLICATIONS

Starck, Lessons in Electric Circuits—vol. II, Chapter 11, Power Factor; copyright 2000-20017 by Tony R. Kuphaldt.*
Starck, Lessons in Electric Circuits—vol. II, Chapter 2, Complex Numbers; copyright 2000-20017 by Tony R. Kuphaldt.*
Hlawatsch et al., Linear and Quadratic Time-Frequency Signal Represenations, Apr. 1992, IEEE SP Magazine.*
Laverty et al., Differential ROCOF Relay for Loss-of-Mains Protection of Renewable Generation using Phasor Measurement over Internet Protocol, Calgary 2009,www.cigre.org.*
Jose Antonio de la O Serna, Synchrophasor Measurement With Polynominal Phase-Locked-Loop Taylor-Fourier Filters, IEEE, Feb. 2015, IEEE Transactions on instrumentation and measurement, vol. 64, No. 2.*
Guo et al., Synchrophasor-Based Islanding Detection for Distributed Generations Sysems Using Systematic Principal Component Analysis Approaches, Dec. 2015, IEEE Transctions on Power Delivery, vol. 30, No. 6.*
European Search Report, EP 15167513 ABB Technology AG, dated Oct. 21, 2015.
Chinese Office Action dated May 22, 2018; ABB Technology AG; 11 pgs. (including translation).

* cited by examiner

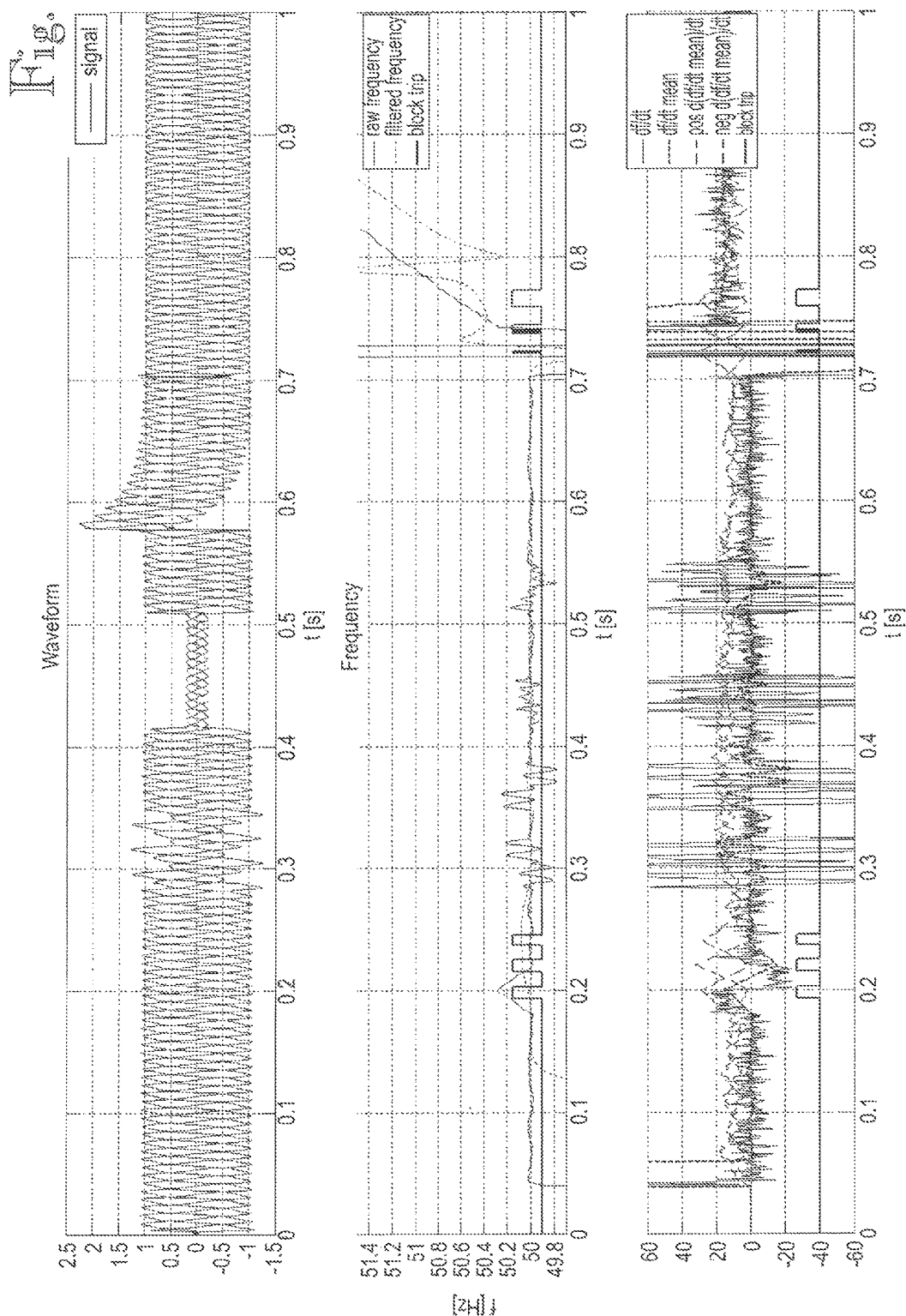

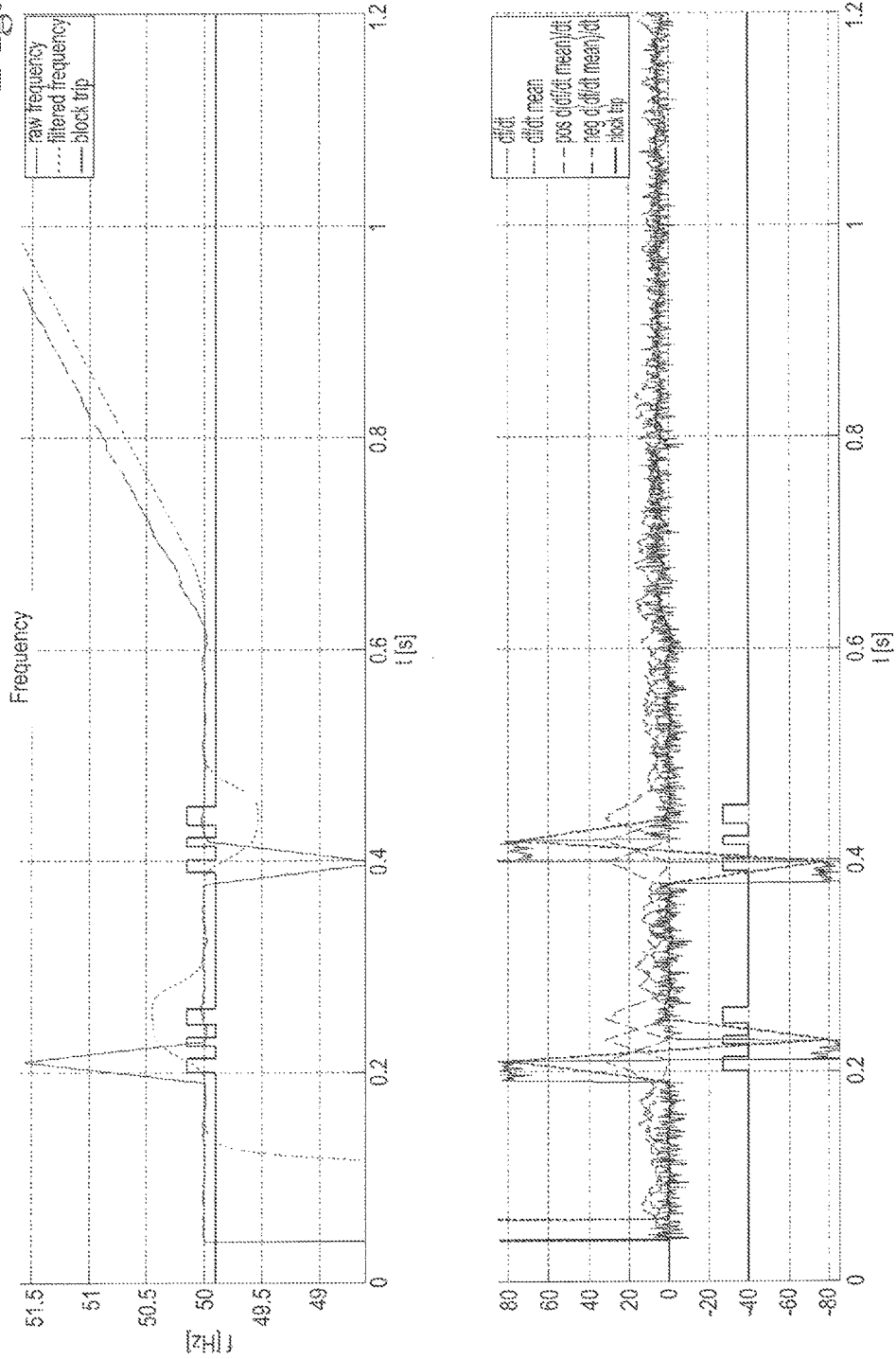

METHOD AND APPARATUS FOR DETECTING VECTOR SHIFT

FIELD OF THE INVENTION

The invention relates to a method and an apparatus for detecting a vector shift in an AC power system.

BACKGROUND OF THE INVENTION

The concept of a vector shift, or voltage vector shift, in an AC power system generally refers to a situation where a sudden change in a cycle length of a voltage wave of the AC power system occurs as a result of a sudden change in a load or power generation in the AC power system, for example. As a result, a single cycle becomes shifted with time, i.e., the cycle in question becomes longer or shorter. Consequently, the phase angle advancement momentarily does not correspond to a normal advancement rate related to a true frequency of the AC power system.

The detection of a vector shift in connection with an AC power system may be used in a vector shift relay used for detecting a disconnection of a generator from the network (an islanding situation), for example.

Another possible purpose for the detection of a vector shift in an AC power system is in connection with frequency measurement and frequency protection. Frequency measurement for frequency protection may in practice measure the advancement of the phase angle. In frequency protection the true network frequency is relevant and not an apparent frequency caused by disturbances. As already explained above, when connecting or disconnecting a load or power generation in the AC power system, for example, a vector shift can occur resulting in a situation where the phase angle advancement momentarily does not correspond to the normal advancement rate related to the true network frequency. The frequency measurement may erroneously see this as a frequency deviation and the frequency protection may unnecessarily trip. Thus, it would be beneficial to detect vector shifts in the system in order to be able to conclude that the result of the frequency measurement may not be correct during the vector shift phenomenon.

A problem with existing solutions for detecting a vector shift in an AC power system is that their sensitivity may not be sufficient and thus they may be able to detect only relatively large vector shifts.

BRIEF DESCRIPTION OF THE INVENTION

The object of the invention is thus to provide a method and an apparatus for implementing the method so as to solve or at least alleviate the above problem or at least to provide an alternative solution. The object of the invention is achieved with a method, a computer program product, and an apparatus that are characterized by what is stated in the independent claims. Preferred embodiments of the invention are described in the dependent claims.

The invention is based on the idea of detecting a vector shift in an AC power system by identifying a characteristic pattern in a voltage waveform of the system caused by the vector shift.

An advantage of the solution of the invention is that it provides good sensitivity and even a relatively small vector shift can be detected in an AC power system. Moreover, the vector shift can be detected fast; essentially within 0.5 to 1 x the fundamental period of the AC power system.

BRIEF DESCRIPTION OF THE FIGURES

In the following, the invention will be described in more detail in connection with preferred embodiments and with reference to the accompanying drawings, in which

FIG. 3 illustrates an example of a curve diagram according to an embodiment; and FIG. 4 illustrates an example of a curve diagram according to an embodiment.

DETAILED DESCRIPTION OF THE INVENTION

The application of the invention is not limited to any specific system, but it can be used in connection with various AC (alternating current) power systems. Moreover, the use of the invention is not limited to systems employing any specific fundamental frequency or any specific voltage level, for example. The AC power system in which the various embodiments are implemented may be a three-phase AC system, for example. Examples of such AC power systems include various electric networks such as distribution networks, transmission networks and parts or portions thereof. The fundamental frequency of the AC power system may be 50 Hz or 60 Hz, for example.

Figure 1:
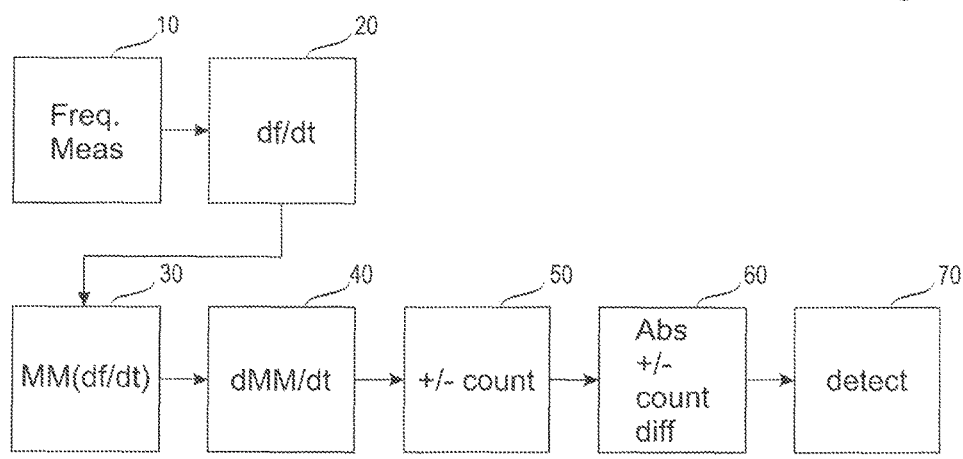
FIG. 1 illustrates an example of a block diagram of an apparatus according to an embodiment.
Figure 2:
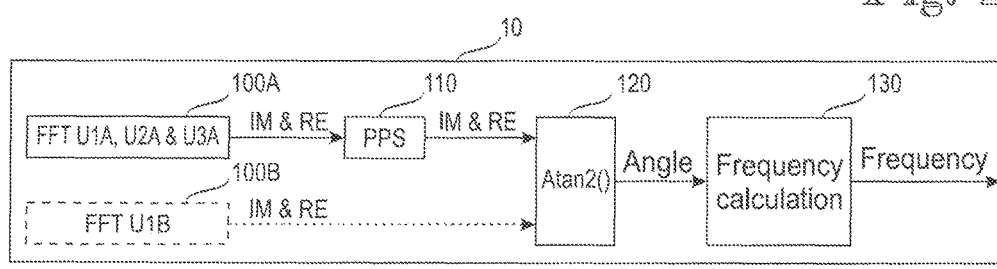
FIG. 2 illustrates an example of a block diagram of frequency measurement according to an embodiment.

FIG. 1 shows a block diagram of an apparatus according to an embodiment. According to an embodiment, the detecting of a vector shift in an AC power system comprises first determining a frequency of the AC power system. This may be performed in the frequency measuring block 10 which is configured to measure the frequency of an AC power system (not shown). According to an embodiment, the determining of the frequency of the AC power system may be performed by comparing a first phase angle of a voltage of the AC power system and a second phase angle of the voltage of the AC power system, such that the first and second phase angles correspond to time points spaced by a fundamental period of the AC power system, wherein the first and second phase angles of the voltage of the AC power system are determined by means of the discrete Fourier transform, which has a length corresponding to the fundamental period of the AC power system. An example of the frequency measuring block 10 is illustrated in FIG. 2. The frequency measuring block 10 may receive voltage information, sampled at a suitable sampling frequency, from the AC power system for the determination of the frequency thereof. The voltage information may be from one phase U1B (phase-to-phase voltage or phase voltage) of the AC power system or from all the phases U1A, U2A, U3A. The voltage or voltages are then subjected to the discrete Fourier transform (DFT) of the sliding window type in a Fourier transform block 100A or 100B, respectively. Preferably, the sliding window type discrete Fourier transform advances one sample at each execution. According to an embodiment, the discrete Fourier transform may be performed by means of a fast Fourier transform (FFT). The length of the Fourier transform preferably corresponds to the fundamental period (i.e. an inverse of the fundamental frequency of the AC power system), which may be 1/50 s or 1/60 s, for example. In case voltages from all the phases are used (block 100A), the result is preferably processed in a positive phase sequence (PPS) block 110. The result from the Fourier transform block 100B or from the positive phase sequence (PPS) block 110, preferably in the form of an imaginary part (IM) and a real part (RE), may then be processed in an atan 2( ) block 120 which outputs corresponding phase angle information. Finally, the frequency calculation block 130 receiving the phase angle information can determine the frequency f of the AC power system on the basis of a difference between a first phase angle of the voltage of the AC power system and a second phase angle of the voltage of the AC power system, such that the first and second phase angles correspond to time points spaced by a fundamental period of the AC power system. According to an embodiment, the frequency f at a given time can be obtained according the following equations:

$$df=((2*\pi+\text{angle1}-\text{angle2})-2*\pi)/(2*\pi), \text{ and}$$

$$f=(1+df)*fn, \text{ where}$$

angle1 (in radians) is a phase angle at the given time,
angle2 (in radians) is a phase angle at a time one fundamental period prior to the given time, and
fn is the fundamental frequency of the AC power system.

When using the above equations, $2*\pi$ may have to be added or subtracted from angle1 if the angles would otherwise be discontinuous when the frequency varies (depending on the angle representation format).

During a vector shift, the raw unfiltered frequency f does a symmetrical pyramid-shaped frequency deviation having sides of constant (at the nominal frequency) or almost constant length and equal to the fundamental period of the AC power (e.g. in a 50 Hz system 1/50 s=20 ms). This property can be utilized in order to detect and distinguish a vector shift. According to an embodiment, this can be implemented as follows:

After determining the frequency f, a time derivative of the frequency, df/dt, is determined in block 20. The time derivative of the frequency, df/dt, is then filtered with a moving window filter, wherein a window of the moving window filter has a length of the fundamental period (e.g. 20 ms in a 50 Hz system) of the AC power system. The purpose of the filtering is to enhance stability and to magnify the rise or fall of the frequency. The window has the length of the fundamental period in order to magnify events with a duration of the fundamental period and to help separate such events from other shorter or longer duration events.

According to an embodiment, the moving window filter can be a moving mean (moving average) filter or a moving median filter. Block 30 exemplifies a moving mean filter MM(df/dt), which may be calculated according to the following general formula, for example:

$$MM(df/dt)=[df/dt(M)+df/dt(M-1)+ \ldots +df/dt(M-n-1)]/n$$

where
n=number of samples.

According to a first alternative embodiment, next, in block 40, time derivatives are calculated for the filtered time derivatives of the frequency over a time period having the length of the fundamental period of the AC power system. Thus, for example in the case of moving median filtering, d(MM(df/dt))/dt is calculated over a time period having the length of the fundamental period of the AC power system, e.g. 20 ms in a 50 Hz system. This is performed to enable checking that the frequency does a constant rise or fall within the time period having the length of the fundamental period of the AC power system. Then, in block 50, a number of positive time derivatives and a number of negative time derivatives among the calculated time derivatives are determined. According to an embodiment, only time derivatives having a magnitude greater than a predetermined lower magnitude threshold and/or time derivatives having a magnitude smaller than a predetermined upper magnitude threshold are taken into account in order to separate noise and other disturbances. After that, in block 60, an absolute value of a difference between the determined number of positive time derivatives and the determined number of negative time derivatives is determined. Finally, in block 70, a vector shift in the AC power system is detected if the determined absolute value of the difference between the number of positive time derivatives and the number of negative time derivatives exceeds a predetermined threshold value. The predetermined threshold may be selected according to system-specific requirements considering on one hand a sensitivity to vector shifts and on the other hand an immunity to other disturbances, for example.

According to a second alternative embodiment, after filtering the time derivative of the frequency, time derivatives are calculated for the filtered time derivatives of the frequency over a first time period having the length of the fundamental period of the AC power system. Then, a number of positive time derivatives and a number of negative time derivatives among the time derivatives calculated over the first time period are determined. According to an embodiment, only time derivatives having a magnitude greater than a predetermined lower magnitude threshold and/or time derivatives having a magnitude smaller than a predetermined upper magnitude threshold are taken into account. Next, an absolute value of a difference between the determined number of positive time derivatives and the determined number of negative time derivatives is determined. If an absolute value of the determined difference between the number of positive time derivatives and the number of negative time derivatives exceeds a predetermined threshold value, time derivatives are calculated for the filtered time derivatives of the frequency over a second time period immediately following the first time period and having a length of the fundamental period of the AC power system. Then, a number of positive time derivatives and a number of negative time derivatives among the time derivatives calculated over the second time period are determined. According to an embodiment, only time derivatives having a magnitude greater than a predetermined lower magnitude threshold and/or time derivatives having a magnitude smaller than a predetermined upper magnitude threshold are taken into account. After that, an absolute value of a difference between the determined number of positive time derivatives and the determined number of negative time derivatives is determined. Finally, a vector shift is detected in the AC power system in response to an absolute value of the difference between the number of positive time derivatives and the number of negative time derivatives calculated over the second time period exceeding the predetermined threshold value. This second alternative embodiment may provide further robustness to the detection of the vector shift, because it identifies both slopes of the pyramid. This, however, delays the vector shift detection in comparison with the first alternative embodiment.

FIG. 3 shows an example of a curve diagram according to an embodiment. The uppermost part of FIG. 3 shows waveforms of three phase voltages of an AC power system as a function of time t. The middle part of FIG. 3 shows corresponding frequency and filtered frequency curves. The lowermost part of FIG. 3 shows corresponding curves for df/dt, filtered df/dt (df/dt mean), and the number of positive (pos) and negative (neg) time derivatives of the filtered df/dt.

The example shows a vector shift at around 0.2 s and at around 0.7 s. In both cases the vector shift can be correctly detected with the proposed method. FIG. 4 shows another example of a curve diagram according to an embodiment. In the example of FIG. 4, two vector shifts of opposing directions are illustrated at around 0.2 s and 0.4 s.

According to an embodiment, the detection of the vector shift according to any one of the embodiments described herein may be used in connection with a frequency protection device for an AC power system. In this case a tripping of a frequency protection may be blocked for a predetermined time period in response to detecting the vector shift in the AC power system. FIGS. 3 and 4 show examples of block trip signals, which are produced in response to the detection of the vector shift. Such a block trip signal may be produced in the detection block 70, for example.

According to an embodiment, the detection of the vector shift according to any one of the embodiments described herein may be used in connection with a vector shift protection device, or generally functionality, for an AC power system. In this case, the tripping of the vector shift protection device may be performed in response to the detection of the vector shift. According to an embodiment, it is further possible to determine a height of the pyramid-shaped frequency deviation, which may indicate the amount of the vector shift in degrees. This information may further be used when deciding on the tripping of the vector shift protection device.

An apparatus according to any one of the embodiments herein, or a combination thereof, may be implemented as one physical unit or as two or more separate physical units that are configured to implement the functionality of the various embodiments. Herein the term 'unit' generally refers to a physical or logical entity, such as a physical device or a part thereof or a software routine. The control arrangement according to any one of the embodiments may be implemented at least partly by means of one or more computers or corresponding digital signal processing (DSP) equipment provided with suitable software, for example. Such a computer or digital signal processing equipment preferably comprises at least a working memory (RAM) providing a storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of the microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention, or a part thereof, may further comprise suitable input means for receiving e.g. measurement and/or control data, and output means for outputting e.g. control or other data. It is also possible to use analog circuits, programmable logic devices (PLD), such as a field-programmable gate array (FPGA), or discrete electric components and devices for implementing the functionality according to any one of the embodiments.

The invention may be implemented in existing electric system components, such as protective relays. Present relays may comprise processors and memory that may be utilized in the functions according to the various embodiments described herein. Thus, all modifications and configurations required for implementing an embodiment in existing electric system components, such as relays, may be performed as software routines, which may be implemented as added or updated software routines. If at least part of the functionality of the invention is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as a suitable memory, e.g. a flash memory or an optical memory, from which it is loadable to the unit or units executing the program code. In addition, such a computer program code implementing the invention may be loaded to the unit or units executing the computer program code via a suitable data network, for example, and it may replace or update a possibly existing program code.

It is obvious to a person skilled in the art that as technology advances, the basic idea of the invention can be implemented in a variety of ways. Consequently, the invention and its embodiments are not restricted to the above examples, but can vary within the scope of the claims.

The invention claimed is:

1. A method for detecting a vector shift in an AC power system, the method comprising:
   a) measuring a frequency of the AC power system on the basis of a difference between a first phase angle of a voltage of the AC power system and a second phase angle of the voltage of the AC power system, the first and second phase angles corresponding to time points spaced by a fundamental period of the AC power system, wherein the first and second phase angles of the voltage of the AC power system are determined by using the discrete Fourier transform of the sliding window type, which has a length corresponding to the fundamental period of the AC power system;
   b) determining a time derivative of the frequency;
   c) filtering the time derivative of the frequency with a moving window filter, wherein a window of the moving window filter has the length of the fundamental period of the AC power system;
   d) calculating time derivatives for filtered time derivatives of the frequency over a time period having the length of the fundamental period of the AC power system;
   e) determining a number of positive time derivatives and a number of negative time derivatives obtained in step d);
   f) detecting a vector shift in the AC power system in response to an absolute value of a difference between the number of positive time derivatives and the number of negative time derivatives obtained in step e) exceeding a predetermined threshold value; and
   g) blocking a tripping of a frequency protection of the AC power system for a predetermined time period in response to detecting the vector shift in the AC power system.

2. The method of claim 1, wherein the moving window filter is a moving average filter or a moving median filter.

3. The method of claim 1, wherein the fundamental period of the AC power system is 1/50 s or 1/60 s.

4. The method of claim 1, wherein the discrete Fourier transform is performed by using a fast Fourier transform.

5. The method of claim 1, wherein in step e), only time derivatives having a magnitude greater than a predetermined lower magnitude threshold and/or time derivatives having a magnitude smaller than a predetermined upper magnitude threshold are taken into account.

6. A method for detecting a vector shift in an AC power system, the method comprising:
   a) measuring a frequency of the AC power system on the basis of a difference between a first phase angle of a voltage of the AC power system and a second phase angle of the voltage of the AC power system, the first and second phase angles corresponding to time points spaced by a fundamental period of the AC power system, wherein the first and second phase angles of the voltage of the AC power system are determined by using the discrete Fourier transform of the sliding window type, which has a length corresponding to the fundamental period of the AC power system;
   b) determining a time derivative of the frequency;
   c) filtering the time derivative of the frequency with a moving window filter, wherein a window of the moving window filter has the length of the fundamental period of the AC power system;
   d) calculating time derivatives for filtered time derivatives of the frequency over a first time period having the length of the fundamental period of the AC power system;
   e) determining a number of positive time derivatives and a number of negative time derivatives obtained in step d);
   f) if an absolute value of a difference between the number of positive time derivatives and the number of negative time derivatives obtained in step e) exceeds a predetermined threshold value, calculating time derivatives for the filtered time derivatives of the frequency over a second time period immediately following the first time period and having the length of the fundamental period of the AC power system;
   g) determining a number of positive time derivatives and a number of negative time derivatives obtained in step f);
   h) detecting a vector shift in the AC power system in response to an absolute value of a difference between the number of positive time derivatives and the number of negative time derivatives obtained in step g) exceeding the predetermined threshold value; and
   i) blocking a tripping of a frequency protection of the AC power system for a predetermined time period in response to detecting the vector shift in the AC power system.

7. The method of claim 6, wherein the moving window filter is a moving average filter or a moving median filter.

8. The method of claim 6, wherein the fundamental period of the AC power system is 1/50 s or 1/60 s.

9. The method of claim 6, wherein the discrete Fourier transform is performed by using a fast Fourier transform.

10. The method of claim 6, wherein in steps e) and g), only time derivatives having a magnitude greater than a predetermined lower magnitude threshold and/or time derivatives having a magnitude smaller than a predetermined upper magnitude threshold are taken into account.

11. A method for detecting a vector shift in an AC power system, the method comprising:
   a) measuring a frequency of the AC power system on the basis of a difference between a first phase angle of a voltage of the AC power system and a second phase angle of the voltage of the AC power system, the first and second phase angles corresponding to time points spaced by a fundamental period of the AC power system, wherein the first and second phase angles of the voltage of the AC power system are determined by using the discrete Fourier transform of the sliding window type, which has a length corresponding to the fundamental period of the AC power system;
   b) determining a time derivative of the frequency;
   c) filtering the time derivative of the frequency with a moving window filter, wherein a window of the moving window filter has the length of the fundamental period of the AC power system;
   d) calculating time derivatives for filtered time derivatives of the frequency over a time period having the length of the fundamental period of the AC power system;
   e) determining a number of positive time derivatives and a number of negative time derivatives obtained in step d);
   f) detecting a vector shift in the AC power system in response to an absolute value of a difference between the number of positive time derivatives and the number of negative time derivatives obtained in step e) exceeding a predetermined threshold value; and
   g) tripping a vector shift protection device of the AC power system in response to detecting the vector shift in the AC power system.

12. The method of claim 11, wherein the moving window filter is a moving average filter or a moving median filter.

13. The method of claim 11, wherein the fundamental period of the AC power system is 1/50 s or 1/60 s.

14. The method of claim 11, wherein the discrete Fourier transform is performed by using a fast Fourier transform.

15. The method of claim 11, wherein in step e), only time derivatives having a magnitude greater than a predetermined lower magnitude threshold and/or time derivatives having a magnitude smaller than a predetermined upper magnitude threshold are taken into account.

16. A method for detecting a vector shift in an AC power system, the method comprising:
   a) measuring a frequency of the AC power system on the basis of a difference between a first phase angle of a voltage of the AC power system and a second phase angle of the voltage of the AC power system, the first and second phase angles corresponding to time points spaced by a fundamental period of the AC power system, wherein the first and second phase angles of the voltage of the AC power system are determined by using the discrete Fourier transform of the sliding window type, which has a length corresponding to the fundamental period of the AC power system;
   b) determining a time derivative of the frequency;
   c) filtering the time derivative of the frequency with a moving window filter, wherein a window of the moving window filter has the length of the fundamental period of the AC power system;
   d) calculating time derivatives for filtered time derivatives of the frequency over a first time period having the length of the fundamental period of the AC power system;
   e) determining a number of positive time derivatives and a number of negative time derivatives obtained in step d);
   f) if an absolute value of a difference between the number of positive time derivatives and the number of negative time derivatives obtained in step e) exceeds a predetermined threshold value, calculating time derivatives for the filtered time derivatives of the frequency over a second time period immediately following the first time period and having the length of the fundamental period of the AC power system;

g) determining a number of positive time derivatives and a number of negative time derivatives obtained in step f); and h) detecting a vector shift in the AC power system in response to an absolute value of a difference between the number of positive time derivatives and the number of negative time derivatives obtained in step g) exceeding the predetermined threshold value; and i) tripping a vector shift protection device of the AC power system in response to detecting the vector shift in the AC power system.

17. The method of claim 16, wherein the moving window filter is a moving average filter or a moving median filter.

18. The method of claim 16, wherein the fundamental period of the AC power system is 1/50 s or 1/60 s.

19. The method of claim 16, wherein the discrete Fourier transform is performed by using a fast Fourier transform.

20. The method of claim 16, wherein in steps e) and g), only time derivatives having a magnitude greater than a predetermined lower magnitude threshold and/or time derivatives having a magnitude smaller than a predetermined upper magnitude threshold are taken into account.

* * * * *